United States Patent
Yeh et al.

(10) Patent No.: US 9,332,666 B2
(45) Date of Patent: May 3, 2016

(54) ELECTRICAL CONNECTOR HAVING AN IMPROVED STIFFENER

(71) Applicant: HON HAI PRECISION INDUSTRY CO., LTD., New Taipei (TW)

(72) Inventors: Cheng-Chi Yeh, New Taipei (TW); Chih-Kai Yang, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 11 days.

(21) Appl. No.: 14/277,816

(22) Filed: May 15, 2014

(65) Prior Publication Data
US 2014/0342611 A1 Nov. 20, 2014

(30) Foreign Application Priority Data
May 15, 2013 (TW) .............................. 102209055 U

(51) Int. Cl.
*H01R 13/62* (2006.01)
*H05K 7/10* (2006.01)

(52) U.S. Cl.
CPC ................... *H05K 7/1061* (2013.01)

(58) Field of Classification Search
CPC . H05K 7/1023; H05K 7/1007; H01R 13/193; H01R 23/684
USPC .......................................... 439/331, 73, 342
See application file for complete search history.

(56) References Cited

U.S. PATENT DOCUMENTS

| 7,025,603 | B2* | 4/2006 | Ma .................................. 439/73 |
| 7,658,632 | B2* | 2/2010 | Xu et al. ....................... 439/331 |
| 7,845,964 | B2* | 12/2010 | Fan ............................... 439/331 |
| 7,896,677 | B2* | 3/2011 | Fan ............................... 439/331 |
| 8,123,543 | B1* | 2/2012 | Terhune, IV .................. 439/331 |
| 8,353,708 | B2* | 1/2013 | Hsu ................................ 439/67 |

* cited by examiner

*Primary Examiner* — Hae Moon Hyeon
(74) *Attorney, Agent, or Firm* — Wei Te Chung; Ming Chieh Chang

(57) ABSTRACT

An electrical connector for electrically connecting an IC package to a substrate, includes an insulating housing (21), a stiffener (20) located on one side of the insulating housing (21) and a load plate (22) assembled to the stiffener (20) and being rotated between an opened position and a closed position, the stiffener (20) includes a first end (203) and an extending portion (208) extending upwardly and then horizontally in a direction far away from the insulating housing (21) from the first end (203), the extending portion (208) includes a receiving hole (209), the load plate (22) includes a body portion (220) and a hook (223) extending from on end of the body portion (220), the hook (223) is assembled to the receiving hole (209) and interlocks with the extending portion (208) to position the load plate (22) on the stiffener (20).

20 Claims, 4 Drawing Sheets

ELECTRICAL CONNECTOR HAVING AN IMPROVED STIFFENER

BACKGROUND OF THE INVENTION

1. Field of the Invention

The present invention relates to an electrical connector, and more particularly to an electrical connector having an improved stiffener to make the load plate exert a balance force on the whole Integrated Circuit (IC) package.

2. Description of Related Art

A conventional electrical connector for connecting an IC package to a substrate includes an insulating housing with a plurality of contacts received therein, a stiffener surrounding the insulating housing, a load plate assembled to the stiffener for pressing the IC package and a lever assembled to the stiffener for keeping the load plate in a closed position. The stiffener includes a main body, a first side, a second side and a pair of third sides extending upwardly from the main body. The first side is opposite to the second side and the pair of third sides connects the first side and the second side. The third side includes an interlock portion interlocked with the lever to keep the lever in a closed position. The load plate is assembled to the first side. The lever is assembled to the second side. The first side includes a pair of holes to permit the load plate being assembled therein to make the load plate position on the stiffener.

When the IC package is assembled to the electrical connector, the load plate presses on the IC package, rotate the lever to the closed position and during this process the load plate is pressed by the lever to the closed position. Due to the rigidity of the first side of the stiffener is 4.5 times of that of the lever, when the lever press the load plate to make it to the closed position, the load plate will exert a unbalance force on the IC package. Thus, the portion of the IC package that endures a little force make the IC package can not contact with the contacts. Thus, the electrical connection between the IC package and the substrate is disconnected.

Hence, it is desirable to provide an improved electrical connector to overcome the aforementioned disadvantages.

SUMMARY OF THE INVENTION

Accordingly, an object of the present invention is to provide an electrical connector having an improved stiffener to make the load plate can exert a balance force on the whole IC package.

According to one aspect of the present invention, An electrical connector for electrically connecting an IC package to a substrate, includes an insulating housing, a stiffener located on one side of the insulating housing and a load plate assembled to the stiffener and being rotated between an opened position and a closed position, the stiffener includes a first end and an extending portion extending upwardly and then horizontally in a direction far away from the insulating housing from the first end, the extending portion includes a receiving hole, the load plate includes a body portion and a hook extending from on end of the body portion, the hook is assembled to the receiving hole and interlocks with the extending portion to position the load plate on the stiffener.

Other objects, advantages and novel features of the invention will become more apparent from the following detailed description when taken in conjunction with the accompanying drawings, in which:

DETAILED DESCRIPTION OF THE INVENTION

Reference will now be made to the drawings to describe the present invention in detail.

Figure 1:
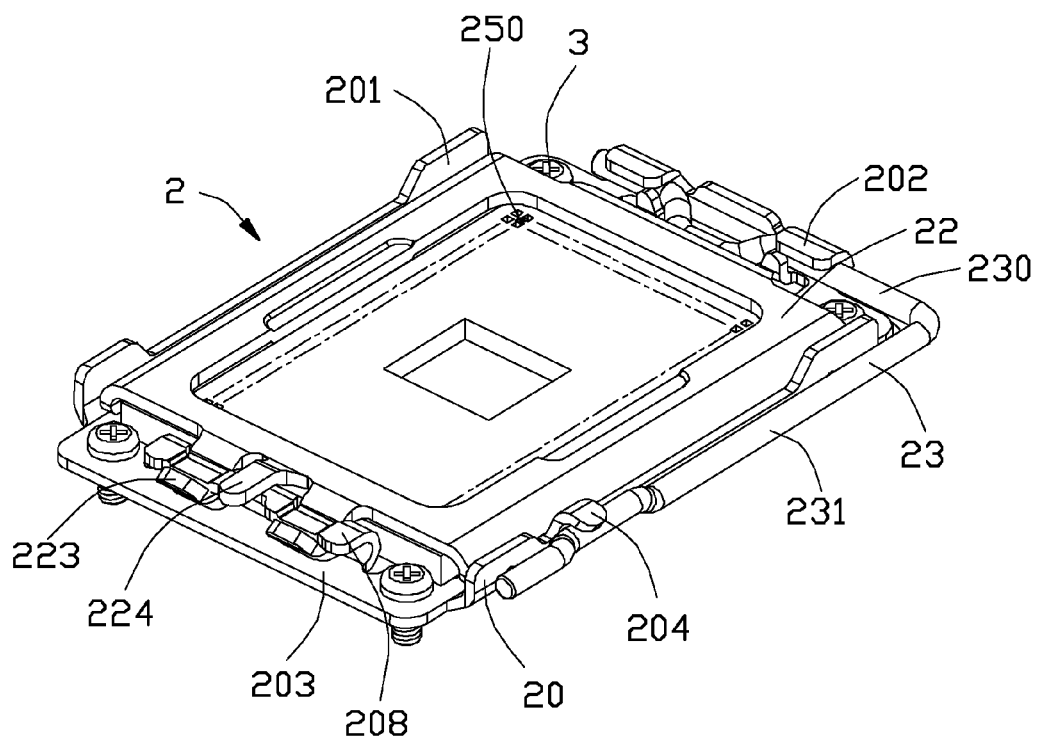
FIG. 1 is an assembled view of an electrical connector according to a preferred embodiment of the present invention.
Figure 2:
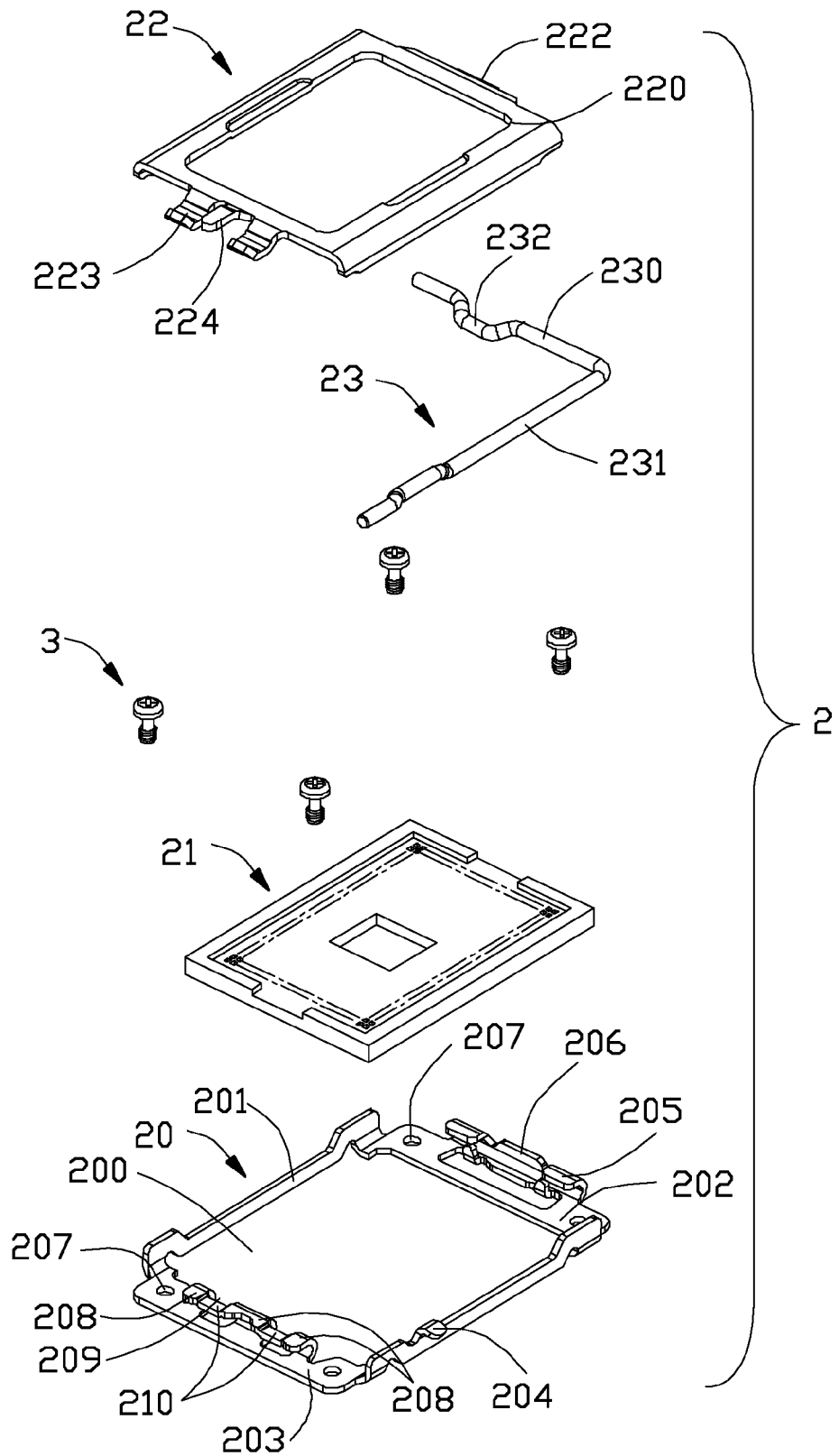
FIG. 2 is an exploded view of the electrical connector as shown in FIG. 1.
Figure 3:
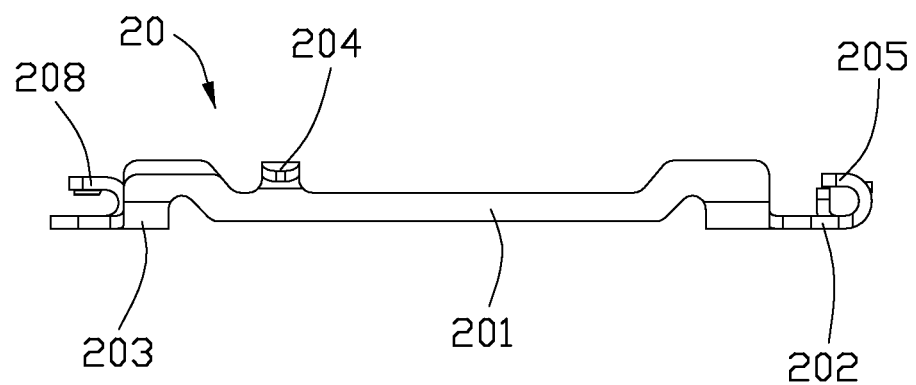
FIG. 3 is a side view of the stiffener of the electrical connector as shown in FIG. 2.
Figure 4:
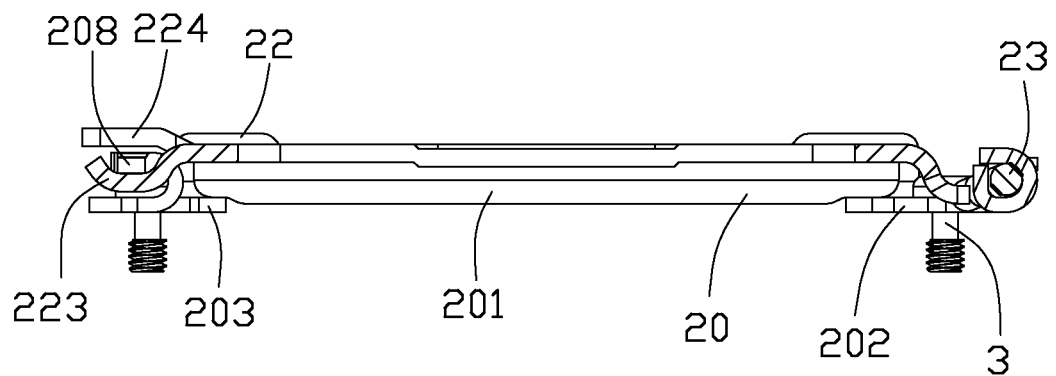
FIG. 4 is a cross-sectional view of the electrical connector as shown in FIG. 1.

FIGS. 1 and 2 illustrates an electrical connector 100 in accordance to a preferred embodiment of the present invention. The electrical connector 100 is used for connecting an IC package (not shown) to a substrate (not shown) and includes an insulating housing 21, a stiffener 20 locates on one side of the insulating housing 21 and is assembled on the substrate, a load plate 22 assembled to the stiffener 20 and covered the insulating housing 21 and a lever 23 assembled to the stiffener 20 and pressed the load plate 22 to an closed position. A plurality of contacts 250 are disposed in the housing 21 for contacting the IC package.

The stiffener 20 is made of metal material and includes a first end 203, a second end 202 opposite to the first end 203 along a front-to-back direction and a pair of connecting portions 201 connecting the first end 203 and the second end 202. The first end 203, the second end 202 and the pair of connecting portions 201 form a window 200. The insulating housing 20 receives in the window 200. Correspondingly, the housing 21 forms opposite first and second ends along the front-to-back direction proximal to the first end 203 and second end 202. The stiffener 20 further includes a plurality of extending portions 208 each extending from the first end 203 and forming a lying U like configuration with inherent elasticity thereof. The extending portion 208 having sections first extends upwardly and then extends horizontally toward a direction far away from the insulating housing 20. The extending portion 208 includes results in a receiving hole 209 thereabouts wherein a connection section 210 is unitarily formed between and downwardly offset from two neighboring extending portions 208 and the corresponding receiving hole 209 is essentially located under the corresponding connection section 210. Notably, the dimension of the connection section in both the front-to-back direction and the transverse direction are larger than a thickness dimension of the stiffener. The extending portion 208 and the first end 203 form a U shape make the extending portion 208 have elasticity. The first end 203 locates in a first plane and the extending portion 208 includes a first portion (not labeled) locates in a second plane parallel with the first plane.

The connecting portion 201 includes an interlock portion 204 interlocked with the lever 23 to keep the lever in the closed position. Each of the first end 203 and the second end 202 includes a pair of holes 207. When the stiffener 20 is assembled to the substrate, a screw 3 goes through the hole 207 and position the stiffener 20 on the substrate. The second end 202 includes a pair of positioning portions 205 forming a U like configuration to position the lever 23 and a locating portion 206 between the pair of positioning portions 205 to prevent the lever being rotated excessively.

The load plate 22 is made of metal material and includes a body portion 220, a tongue portion 222 and a pair of hooks 223 extending from two opposite ends of the body portion 220. The load plate 22 further includes a tail portion 224 between the pair of hooks 223. Each of the hooks 223 is assembled to the receiving hole 209 of the extending portion 208 of the stiffener 20. The tail portion 224 locates on the upper surface of the extending portion 208. The load plate 22 can be rotated around the extending portion 208 between an opened position and a closed position.

The lever 23 includes a shaft portion 230 assembled to the stiffener 20 and defining a pivot axis along a transverse direction perpendicular to the front-to-back direction and an operation portion 231 perpendicular to the shaft portion 230. The shaft portion 230 is assembled to the positioning portions 205 of the stiffener 20 to position the lever 23 on the stiffener 20. The shaft portion 230 includes a press portion 232 located at the middle thereof and offset from shaft portion 230 for pressing the tongue portion 222 of the load plate 22. The operation portion 231 hooks with the interlock portion 204 to keep the lever 23 in the closed position.

In this invention, the stiffener 20 includes the first end 203 and the extending portion 208 extending from the first end 203 first upwardly and then in a horizontal direction, thus the extending portion 208 has elasticity, when the load plate 22 is rotated to the closed position, the extending portion 208 can deform at least in a vertical direction to make the load plate 22 exert a balance force on the whole IC package, which ensures a robust electrical connection between the IC package and the substrate. It is also noted that in the prior art design the hook of the load plate abuts against only the side of the stiffener along the thickness direction with less dimensions thereof while in the instant invention the hook 223 of the load plate 22 may abut against the connection section 210 with a dimension spanning in the front-to-back direction much larger than that spanning in the thickness direction of the stiffener 20. To simplify illustration, the extending portions 208 and the connection sections 210 therebetween may be commonly called as the extending portion where the hook 223 is located.

While the preferred embodiments in accordance with the present invention has been shown and described, equivalent modifications and changes known to persons skilled in the art according to the spirit of the present invention are considered within the scope of the present invention as defined in the appended claims.

What is claimed is:

1. An electrical connector for electrically connecting an IC package to a substrate, comprising:
   an insulating housing;
   a stiffener located on one side of the insulating housing and including a first end and a one piece extending portion extending upwardly and then horizontally in a front-to-back direction far away from the insulating housing from the first end, the extending portion including a receiving hole;
   a load plate assembled to the extending portion of the stiffener and being rotated between an opened position and a closed position, the load plate including a body portion and a hook extending from one end of the body portion, the hook being assembled to the receiving hole and interlocking with the extending portion to position the load plate on the stiffener; wherein
   the extension portion defines a dimension corresponding to said receiving hole along both said front-to-back direction and a transverse direction perpendicular to said front-to-back direction, are larger than a thickness dimension of the stiffener.

2. The electrical connector as claimed in claim 1, wherein the extending portion and the first end forming a U shape, the first end locates in a first plane and the extending portion includes a first portion locates in a second plane parallel with the first plane.

3. The electrical connector as claimed in claim 1, wherein load plate includes a tail portion located on the upper surface of the extending portion of the stiffener.

4. The electrical connector as claimed in claim 1, wherein the stiffener includes a second end opposite to the first end, the electrical connector further includes a lever assembled to the second end.

5. The electrical connector as claimed in claim 4, wherein the load plate includes a tongue portion extending from the body portion, the lever includes a press portion pressing the tongue portion to keep the load plate in the closed position.

6. The electrical connector as claimed in claim 4, wherein each of the first end and the second end includes a hole to permit a screw going through to position the stiffener on the substrate.

7. An electrical connector for electrically connecting an IC package to a substrate, comprising:
   an insulating housing;
   a stiffener located on one side of the insulating housing and including a first end and a one piece extending portion extending from the first end, the extending portion and the first end forming a U shape, the first end locating in a first horizontal plane and the extending portion including a first portion locates in a second horizontal plane parallel with the first plane, the extending portion including a receiving hole;
   a load plate assembled to the extending portion of the stiffener and being rotated between an opened position and a closed position, the load plate including a body portion and a hook extending from one end of the body portion, the hook being assembled to the receiving hole and interlocking with the extending portion to position the load plate on the stiffener; wherein
   said extending portion is upwardly deformed by the hook.

8. The electrical connector as claimed in claim 7, wherein the extending portion first extending upwardly and then horizontally in a direction far away from the insulating housing.

9. The electrical connector as claimed in claim 7, wherein load plate includes a tail portion locates on the upper surface of the extending portion of the stiffener.

10. The electrical connector as claimed in claim 7, wherein the stiffener includes a second end opposite to the first end, the electrical connector further includes a lever assembled to the second end.

11. The electrical connector as claimed in claim 10, wherein the load plate includes a tongue portion extending from the body portion, the lever includes a press portion pressing the tongue portion to keep the load plate in the closed position.

12. An electrical connector for use with an electronic package, comprising:
   an insulative housing defining opposite first and second ends along a front-to-back direction;
   a plurality of contacts disposed in the housing;
   a metallic stiffener surrounding the housing at least at said two opposite first and second ends;
   a lever pivotally mounted to the second end of the stiffener with a press portion offset from thereof a pivot axis extending along a transverse direction perpendicular to said front-to-back direction; and
   a load plate pivotally mounted to the first end of the stiffener with a hook structure received within a receiving hole formed in a one piece extending portion which unitarily extends upwardly at the first end of the stiffener;

wherein
said extending portion defines a curved cross-section to be upwardly deformable in a vertical direction perpendicular to both said front-to-back direction and said transverse direction during experiencing an upward pressure from the hook structure of the load plate and a corresponding upward deformation.

13. The electrical connector as claimed in claim 12, wherein said curved cross-section defines a U like configuration.

14. The electrical connector as claimed in claim 13, wherein said U like configuration is in a lying manner opening to an exterior in the front-to-back direction.

15. The electrical connector as claimed in claim 14, wherein said stiffener forms another U like configuration of a cross-section of another structure at the second end thereof to retain the lever, both said two U like configurations of a similar height in the vertical direction.

16. The electrical connector as claimed in claim 12, wherein the hook structure engages the extending portion with a dimension spanning in the front-to-back direction which is perpendicular to a thickness direction of said extending portion.

17. The electrical connector as claimed in claim 12, wherein said receiving hole extends into the first end of the stiffener.

18. The electrical connector as claimed in claim 12, wherein the hook structure engages a connection section which is downwardly offset from the extending portion.

19. The electrical connector as claimed in claim 12, wherein said stiffener fully circumferentially surrounds the housing.

20. The electrical connector as claimed in claim 12, wherein a dimension of said extending portion corresponding to said receiving hole along both the front-to-back direction and said transverse direction is larger than a thickness dimension of said stiffener.

* * * * *